United States Patent
Iwasaki et al.

(10) Patent No.: US 9,196,268 B2
(45) Date of Patent: Nov. 24, 2015

(54) MAGNETIC HEAD MANUFACTURING METHOD FORMING SENSOR SIDE WALL FILM BY OVER-ETCHING MAGNETIC SHIELD

(71) Applicant: KABUSHIKI KAISHA TOSHIBA, Tokyo (JP)

(72) Inventors: Hitoshi Iwasaki, Tokyo (JP); Masayuki Takagishi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/549,428

(22) Filed: Nov. 20, 2014

(65) Prior Publication Data

US 2015/0144592 A1    May 28, 2015

Related U.S. Application Data

(62) Division of application No. 13/850,458, filed on Mar. 26, 2013, now abandoned.

(30) Foreign Application Priority Data

Mar. 26, 2012   (JP) ................................. 2012-069974

(51) Int. Cl.
*G11B 5/39* (2006.01)
*G11B 5/11* (2006.01)
*G01R 33/09* (2006.01)

(52) U.S. Cl.
CPC .............. *G11B 5/112* (2013.01); *G01R 33/093* (2013.01); *G11B 5/11* (2013.01); *G11B 5/3912* (2013.01); *G11B 5/3932* (2013.01); *G11B 2005/3996* (2013.01); *Y10T 29/49052* (2015.01)

(58) Field of Classification Search
CPC .................... G11B 5/39; G11B 5/3993; G11B 2005/3996; Y10T 29/4902; Y10T 29/49078

USPC ................... 29/603.01–603.27; 360/313–328
See application file for complete search history.

(56) References Cited

U.S. PATENT DOCUMENTS 3,899,834 A    8/1975   Harrison, Jr.
4,103,315 A    7/1978   Hempstead et al.
(Continued)

FOREIGN PATENT DOCUMENTS

JP    64-070947    3/1989
JP    05-20635     1/1993
(Continued)

OTHER PUBLICATIONS

X. Zhu and J.-G. Zhu, "Bias-Field-Free Microwave Oscillator Driven by Perpendicularly Polarized Spin Current," IEEE Trans. Magn. vol. 42, No. 10, pp. 2670-2672, Oct. 2006.
(Continued)

*Primary Examiner* — Craig A. Renner
(74) *Attorney, Agent, or Firm* — Nixon & Vanderhye, P.C.

(57) ABSTRACT

According to one embodiment, a magnetic head includes a reproducing unit to detect a medium magnetic field recorded in a magnetic recording medium. The reproducing unit includes first and second magnetic shields, a stacked body, and a side wall film. The stacked body is provided between the first and second magnetic shields and includes first and second magnetic layer and an intermediate layer provided between them. The stacked body has a side wall. The side wall intersects a plane perpendicular to a stacking direction from the first magnetic shield toward the second magnetic shield. The side wall film covers at least a part of the side wall of the stacked body. The side wall film includes at least one of Fe and Co, and has a composition different from a composition of the first magnetic layer and different from a composition of the second magnetic layer.

16 Claims, 11 Drawing Sheets

(56) References Cited

U.S. PATENT DOCUMENTS

| | | |
|---|---|---|
| 4,782,415 A | 11/1988 | Vinal |
| 4,945,528 A | 7/1990 | Crasemann |
| 5,499,150 A | 3/1996 | Kawana et al. |
| 5,695,864 A | 12/1997 | Slonczewski |
| 5,748,399 A | 5/1998 | Gill |
| 5,768,066 A | 6/1998 | Akiyama et al. |
| 5,898,546 A | 4/1999 | Kanai et al. |
| 5,920,447 A | 7/1999 | Sakata et al. |
| 6,011,664 A | 1/2000 | Kryder et al. |
| 6,094,328 A | 7/2000 | Saito |
| 6,132,892 A | 10/2000 | Yoshikawa et al. |
| 6,153,062 A | 11/2000 | Saito et al. |
| 6,278,576 B1 | 8/2001 | Ogata et al. |
| 6,282,069 B1 | 8/2001 | Nakazawa et al. |
| 6,519,119 B1 | 2/2003 | van der Heijden et al. |
| 6,580,589 B1 | 6/2003 | Gill |
| 6,583,969 B1 | 6/2003 | Pinarbasi |
| 6,591,479 B2 | 7/2003 | Nakazawa et al. |
| 6,608,739 B1 | 8/2003 | Tanaka et al. |
| 6,621,664 B1 | 9/2003 | Trindade et al. |
| 6,697,231 B1 | 2/2004 | Kikuiri |
| 6,785,092 B2 | 8/2004 | Covington et al. |
| 6,809,900 B2 | 10/2004 | Covington |
| 6,836,971 B1 | 1/2005 | Wan |
| 6,927,952 B2 | 8/2005 | Shimizu et al. |
| 6,937,446 B2 | 8/2005 | Kamiguchi et al. |
| 6,977,108 B2 | 12/2005 | Hieda et al. |
| 6,980,469 B2 | 12/2005 | Kent et al. |
| 6,982,845 B2 | 1/2006 | Kai et al. |
| 7,106,555 B2 | 9/2006 | Kikuiri et al. |
| 7,119,990 B2 | 10/2006 | Bajorek et al. |
| 7,120,988 B2 | 10/2006 | Le et al. |
| 7,145,752 B2 | 12/2006 | Ueda et al. |
| 7,154,707 B2 | 12/2006 | Watabe et al. |
| 7,256,955 B2 | 8/2007 | Pokhil et al. |
| 7,397,633 B2 | 7/2008 | Xue et al. |
| 7,461,933 B2 | 12/2008 | Deily et al. |
| 7,466,525 B2 | 12/2008 | Hasegawa et al. |
| 7,471,491 B2 | 12/2008 | Sato et al. |
| 7,473,478 B2 | 1/2009 | Sbiaa et al. |
| 7,486,475 B2 | 2/2009 | Biskeborn |
| 7,504,898 B2 | 3/2009 | Fukuzawa et al. |
| 7,532,433 B2 | 5/2009 | Kawato et al. |
| 7,532,434 B1 | 5/2009 | Schreck et al. |
| 7,593,185 B2 | 9/2009 | Yazawa |
| 7,616,412 B2 | 11/2009 | Zhu et al. |
| 7,675,129 B2 | 3/2010 | Inomata et al. |
| 7,724,469 B2 | 5/2010 | Gao et al. |
| 7,732,881 B2 | 6/2010 | Wang |
| 7,764,136 B2 | 7/2010 | Suzuki et al. |
| 7,791,829 B2 | 9/2010 | Takeo et al. |
| 7,808,330 B2 | 10/2010 | Fukuzawa et al. |
| 7,813,087 B2 | 10/2010 | Sato et al. |
| 7,817,375 B2 | 10/2010 | Sato et al. |
| 7,818,890 B2 | 10/2010 | Duric et al. |
| 7,876,531 B2 | 1/2011 | Bozeman et al. |
| 7,911,882 B2 | 3/2011 | Shimazawa et al. |
| 7,957,098 B2 | 6/2011 | Yamada et al. |
| 8,081,397 B2 | 12/2011 | Funayama et al. |
| 8,139,322 B2 | 3/2012 | Yamada et al. |
| 8,154,825 B2 | 4/2012 | Takashita et al. |
| 8,164,854 B2 | 4/2012 | Takagishi et al. |
| 8,238,058 B2 | 8/2012 | Shimizu et al. |
| 8,238,060 B2 | 8/2012 | Yamada et al. |
| 8,264,799 B2 | 9/2012 | Akiyama et al. |
| 8,270,112 B2 | 9/2012 | Funayama et al. |
| 8,295,009 B2 | 10/2012 | Yamada et al. |
| 8,320,079 B2 | 11/2012 | Iwasaki et al. |
| 8,325,442 B2 | 12/2012 | Koui et al. |
| 8,400,734 B2 | 3/2013 | Yamada et al. |
| 8,467,148 B2 | 6/2013 | Iwasaki et al. |
| 8,547,662 B2 | 10/2013 | Yamada et al. |
| 8,654,480 B2 | 2/2014 | Shimizu et al. |
| 8,687,321 B2 | 4/2014 | Yamada et al. |
| 8,767,346 B2 | 7/2014 | Yamada et al. |
| 2001/0017746 A1 | 8/2001 | Nishida et al. |
| 2001/0017752 A1 | 8/2001 | Hoshiya et al. |
| 2002/0006013 A1 | 1/2002 | Sato et al. |
| 2002/0014016 A1 | 2/2002 | Kato |
| 2002/0051330 A1 | 5/2002 | Heijden et al. |
| 2002/0075595 A1 | 6/2002 | Sato et al. |
| 2002/0097536 A1 | 7/2002 | Komuro et al. |
| 2002/0136927 A1 | 9/2002 | Hieda et al. |
| 2002/0155321 A1 | 10/2002 | Kawasaki et al. |
| 2002/0191354 A1 | 12/2002 | Yoshikawa et al. |
| 2003/0026040 A1 | 2/2003 | Covington et al. |
| 2003/0090844 A1 | 5/2003 | Shimizu et al. |
| 2004/0070869 A1 | 4/2004 | Nishida et al. |
| 2004/0145828 A1 | 7/2004 | Im |
| 2004/0150912 A1 | 8/2004 | Kawato et al. |
| 2004/0190197 A1 | 9/2004 | Watabe et al. |
| 2004/0228045 A1 | 11/2004 | Hasegawa et al. |
| 2004/0252417 A1 | 12/2004 | Hasegawa et al. |
| 2005/0023938 A1 | 2/2005 | Sato et al. |
| 2005/0088789 A1 | 4/2005 | Hou et al. |
| 2005/0105213 A1 | 5/2005 | Takeo et al. |
| 2005/0110004 A1 | 5/2005 | Parkin et al. |
| 2005/0111137 A1 | 5/2005 | Ju et al. |
| 2005/0193578 A1 | 9/2005 | Toda |
| 2005/0207050 A1 | 9/2005 | Pokhil et al. |
| 2005/0219767 A1 | 10/2005 | Nakamura et al. |
| 2005/0219771 A1 | 10/2005 | Sato et al. |
| 2006/0039089 A1 | 2/2006 | Sato |
| 2006/0171051 A1 | 8/2006 | Wachenschwanz et al. |
| 2006/0187580 A1 | 8/2006 | Samofalov et al. |
| 2006/0198047 A1 | 9/2006 | Xue et al. |
| 2006/0213070 A1 | 9/2006 | Goldsobel et al. |
| 2006/0221507 A1 | 10/2006 | Sato et al. |
| 2007/0063237 A1 | 3/2007 | Huai et al. |
| 2007/0089311 A1 | 4/2007 | Amundson et al. |
| 2007/0109147 A1 | 5/2007 | Fukuzawa et al. |
| 2007/0253122 A1 | 11/2007 | Fukuzawa et al. |
| 2008/0019040 A1 | 1/2008 | Zhu et al. |
| 2008/0112087 A1 | 5/2008 | Clinton et al. |
| 2008/0117545 A1 | 5/2008 | Batra et al. |
| 2008/0129401 A1 | 6/2008 | Fukuzawa et al. |
| 2008/0137224 A1 | 6/2008 | Gao et al. |
| 2008/0144232 A1 | 6/2008 | Kaka et al. |
| 2008/0150643 A1 | 6/2008 | Suzuki et al. |
| 2008/0165452 A1 | 7/2008 | Bozeman et al. |
| 2008/0180838 A1 | 7/2008 | Im et al. |
| 2008/0208733 A1 | 8/2008 | Robb et al. |
| 2008/0218891 A1 | 9/2008 | Gubbins et al. |
| 2008/0231998 A1 | 9/2008 | Yoshikawa et al. |
| 2008/0268291 A1 | 10/2008 | Akiyama et al. |
| 2008/0304176 A1 | 12/2008 | Takagishi et al. |
| 2009/0034132 A1 | 2/2009 | Miyauchi et al. |
| 2009/0052095 A1 | 2/2009 | Yamada et al. |
| 2009/0059417 A1 | 3/2009 | Takeo et al. |
| 2009/0059418 A1 | 3/2009 | Takeo et al. |
| 2009/0059423 A1 | 3/2009 | Yamada et al. |
| 2009/0080105 A1 | 3/2009 | Takashita et al. |
| 2009/0080106 A1 | 3/2009 | Shimizu et al. |
| 2009/0080109 A1 | 3/2009 | Fukuzawa et al. |
| 2009/0080120 A1 | 3/2009 | Funayama et al. |
| 2009/0088095 A1 | 4/2009 | Kayano |
| 2009/0097167 A1 | 4/2009 | Sato et al. |
| 2009/0097169 A1 | 4/2009 | Sato et al. |
| 2009/0115541 A1 | 5/2009 | Persson et al. |
| 2009/0225465 A1 | 9/2009 | Iwasaki et al. |
| 2009/0257151 A1 | 10/2009 | Zhang et al. |
| 2009/0262457 A1 | 10/2009 | Rivkin et al. |
| 2009/0316303 A1 | 12/2009 | Yamada et al. |
| 2009/0316304 A1 | 12/2009 | Funayama et al. |
| 2010/0007992 A1 | 1/2010 | Yamada et al. |
| 2010/0007996 A1 | 1/2010 | Iwasaki et al. |
| 2010/0027158 A1 | 2/2010 | Takagishi et al. |
| 2010/0110592 A1 | 5/2010 | Koui et al. |
| 2010/0134922 A1 | 6/2010 | Yamada et al. |
| 2010/0220415 A1 | 9/2010 | Yamada et al. |
| 2011/0038080 A1 | 2/2011 | Alex et al. |
| 2011/0134561 A1 | 6/2011 | Smith et al. |
| 2011/0205655 A1 | 8/2011 | Shimizu et al. |
| 2011/0299192 A1 | 12/2011 | Yamada et al. |

(56) References Cited

U.S. PATENT DOCUMENTS

| | | |
|---|---|---|
| 2011/0300409 A1 | 12/2011 | Yamada et al. |
| 2012/0063035 A1 | 3/2012 | Childress et al. |
| 2012/0250189 A1 | 10/2012 | Degawa et al. |
| 2012/0268844 A1 | 10/2012 | Yamada et al. |
| 2012/0275060 A1 | 11/2012 | Shimizu et al. |
| 2013/0329317 A1 | 12/2013 | Yamada et al. |

FOREIGN PATENT DOCUMENTS

| | | |
|---|---|---|
| JP | 07-244801 | 9/1995 |
| JP | H11-154609 | 6/1999 |
| JP | 2001-243602 | 9/2001 |
| JP | 2002-100005 | 4/2002 |
| JP | 2002-109712 | 4/2002 |
| JP | 2002-208744 | 7/2002 |
| JP | 2002-217029 | 8/2002 |
| JP | 2002-279616 | 9/2002 |
| JP | 2003-317220 | 11/2003 |
| JP | 2004-192744 | 7/2004 |
| JP | 2004-207707 | 7/2004 |
| JP | 2004-221298 | 8/2004 |
| JP | 2004-234830 | 8/2004 |
| JP | 2004-295987 | 10/2004 |
| JP | 2005-108315 | 4/2005 |
| JP | 2005-525663 | 8/2005 |
| JP | 2005-285242 | 10/2005 |
| JP | 2005-294376 | 10/2005 |
| JP | 2005-310363 | 11/2005 |
| JP | 2006-080385 | 3/2006 |
| JP | 2006-086508 | 3/2006 |
| JP | 2006-134540 | 5/2006 |
| JP | 2006-147023 | 6/2006 |
| JP | 2006-209960 | 8/2006 |
| JP | 2006-209964 | 8/2006 |
| JP | 2006-244693 | 9/2006 |
| JP | 2006-286855 | 10/2006 |
| JP | 3833512 | 10/2006 |
| JP | 2007-012264 | 1/2007 |
| JP | 2007-035251 | 2/2007 |
| JP | 2007-116003 | 5/2007 |
| JP | 2007-124340 | 5/2007 |
| JP | 2007-184923 | 7/2007 |
| JP | 2007-193906 | 8/2007 |
| JP | 2007-299880 | 11/2007 |
| JP | 2008-109118 | 5/2008 |
| JP | 2008-123669 | 5/2008 |
| JP | 2008-176908 | 7/2008 |
| JP | 2009-070439 | 4/2009 |
| JP | 2009-070541 | 4/2009 |
| JP | 2010-003354 | 1/2010 |
| KR | 1020030039289 | 5/2003 |
| WO | 2006-101040 | 9/2006 |

OTHER PUBLICATIONS

Zhu et al., "Microwave Assisted Magnetic Recording (MAMR)," Digest of the 18$^{th}$ Magnetic Recording conference, pp. 34-35, 2007.

Maat et al., "Magnetotransport properties and spin-torque effects in current perpendicular to the plane spin valves with Co-Fe-Al magnetic layers", Journal of Applied Physics 101, 093905 (2007); May 9, 2007.

Park et al., "Effect of Adjacent Layers on Crystallization and Magnetoresistance in CoFeB/MgO/CoFeB Magnetic Tunnel Junction", IEEE Transactions of Magnetics, vol. 42, No. 10, Oct. 2006, pp. 2639-2641.

Shen et al., "Effect of Film Roughness in MgO-based Magnetic Tunnel Junctions", Applied Physics Letters 88, 182508 (2006).

Tang et al., "Narrow Track Confinement by AC Field Generation Layer in Microwave Assisted Magnetic Recording", vol. 44, Issue 11, pp. 3376-3379 (Nov. 2008).

Takeo et al., U.S. Appl. No. 12/196,841, filed Aug. 22, 2008—now abandoned.

Iwasaki et al., U.S. Appl. No. 12/232,014, filed Sep. 9, 2008—now abandoned.

Shimizu et al., U.S. Appl. No. 12/232,469, filed Sep. 17, 2008—now abandoned.

Takagishi et al., U.S. Appl. No. 12/461,027, filed Jul. 29, 2009—now abandoned.

Takagishi et al., U.S. Appl. No. 13/071,681, filed Mar. 25, 2011—now abandoned.

Yamada et al., U.S. Appl. No. 13/966,126, filed Aug. 13, 2013—now abandoned.

Office Action mailed Sep. 18, 2013 in counterpart Japanese Application No. 2012-069974 and English-language translation of same.

Office Action mailed Jun. 11, 2014 in counterpart Japanese Application No. 2012-069974 and English-language translation of same.

English-language machine translation of JP H11-154609, Jun. 8, 1999.

US 9,196,268 B2

MAGNETIC HEAD MANUFACTURING METHOD FORMING SENSOR SIDE WALL FILM BY OVER-ETCHING MAGNETIC SHIELD

CROSS-REFERENCE TO RELATED APPLICATIONS

This application is a divisional of application Ser. No. 13/850,458, filed Mar. 26, 2013, which is based upon and claims the benefit of priority from the prior Japanese Patent Application No. 2012-069974, filed on Mar. 26, 2012; the entire contents of which are incorporated herein by reference.

FIELD

Embodiments described herein relate generally to a magnetic head, a magnetic head assembly, a magnetic recording and reproducing apparatus, and a method for manufacturing a magnetic head.

BACKGROUND

In a magnetic recording and reproducing apparatus, information stored in a magnetic recording medium such as a hard disk drive is read out by a magneto-resistance effect (MR) magnetic head. High-sensitivity reproduction is desired for the magnetic head.

DETAILED DESCRIPTION

Figure 1A:
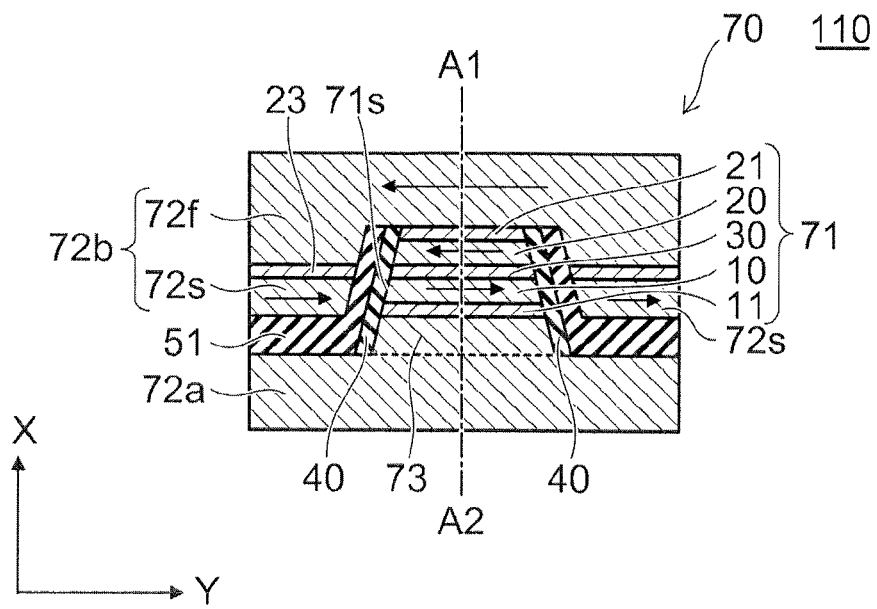
FIG. 1A and FIG. 1B are schematic views illustrating the configuration of a magnetic head according to a first embodiment.

According to one embodiment, a magnetic head includes a reproducing unit configured to detect a medium magnetic field recorded in a magnetic recording medium. The reproducing unit includes a first magnetic shield, a second magnetic shield, a stacked body, and a side wall film. The stacked body is provided between the first magnetic shield and the second magnetic shield. The stacked body includes a first magnetic layer, a second magnetic layer, and an intermediate layer provided between the first magnetic layer and the second magnetic layer. The stacked body has a side wall. The side wall intersects a plane perpendicular to a stacking direction from the first magnetic shield toward the second magnetic shield. The side wall film covers at least a part of the side wall of the stacked body. The side wall film includes at least one of Fe and Co, and has a composition different from a composition of the first magnetic layer and different from a composition of the second magnetic layer.

According to one embodiment, a magnetic head assembly includes a magnetic head, a suspension, and an actuator arm. The magnetic head including a reproducing unit configured to detect a medium magnetic field recorded in a magnetic recording medium. The reproducing unit includes a first magnetic shield, a second magnetic shield, a stacked body, and a side wall film. The stacked body is provided between the first magnetic shield and the second magnetic shield. The stacked body includes a first magnetic layer, a second magnetic layer, and an intermediate layer provided between the first magnetic layer and the second magnetic layer. The stacked body has a side wall. The side wall intersects a plane perpendicular to a stacking direction from the first magnetic shield toward second magnetic shield. The side wall film covers at least a part of the side wall of the stacked body. The side wall film includes at least one of Fe and Co, and has a composition different from a composition of the first magnetic layer and different from a composition of the second magnetic layer. The magnetic head is mounted at one end of the suspension. The actuator arm is connected to another end of the suspension.

According to one embodiment, a magnetic recording and reproducing apparatus includes a magnetic head assembly and a magnetic recording medium. The magnetic head assembly includes a magnetic head, a suspension, and an actuator arm. The magnetic head includes a reproducing unit configured to detect a medium magnetic field recorded in the magnetic recording medium. The reproducing unit includes a first magnetic shield, a second magnetic shield, a stacked body, and a side wall film. The stacked body is provided between the first magnetic shield and the second magnetic shield. The stacked body includes a first magnetic layer, a second magnetic layer, and an intermediate layer provided between the first magnetic layer and the second magnetic layer. The stacked body has a side wall. The side wall intersects a plane perpendicular to a stacking direction from the first magnetic shield toward second magnetic shield. The side wall film covers at least a part of the side wall of the stacked body. The side wall film includes at least one of Fe and Co, and having a composition different from a composition of the first magnetic layer and different from a composition of the second magnetic layer. The magnetic head is mounted at one end of the suspension. The actuator arm is connected to another end of the suspension. From the magnetic recording medium, information is reproduced using the magnetic head mounted on the magnetic head assembly.

According to one embodiment, a method for manufacturing a magnetic head is provided. The method can include forming a stacked film on a first magnetic shield including at least one of Fe and Co. The stacked film is configured to form a stacked body. The stacked body includes a first magnetic layer, a second magnetic layer, and an intermediate layer provided between the first magnetic layer and the second magnetic layer. The method can include forming the stacked body by removing a part of the stacked film by etching. The method can include forming a side wall film by over-etching the first magnetic shield to cause a material included in the first magnetic shield to adhere to a side wall of the stacked body. The side wall film including at least one of Fe and Co and has a composition different from a composition of the first magnetic layer and different from a composition of the second magnetic layer. The method can include forming a second magnetic shield on the stacked body to form a reproducing unit configured to detect a medium magnetic field recorded in a magnetic recording medium.

According to one embodiment, a method for manufacturing a magnetic head is provided. The method can include forming a stacked film on a first magnetic shield. The stacked film is configured to form a stacked body. The stacked body includes a first magnetic layer, a second magnetic layer, and an intermediate layer provided between the first magnetic layer and the second magnetic layer. The method can include forming the stacked body by removing a part of the stacked film by etching, while forming a side wall film including at least one of Fe and Co and having a composition different from a composition of the first magnetic layer and different from a composition of the second magnetic layer by causing a material included in the stacked film to adhere to a side wall of the 10 stacked body. The method can include forming a second magnetic shield on the stacked body to form a reproducing unit configured to detect a medium magnetic field recorded in a magnetic recording medium.

Hereinbelow, embodiments are described with reference to the drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

Figure 1B:
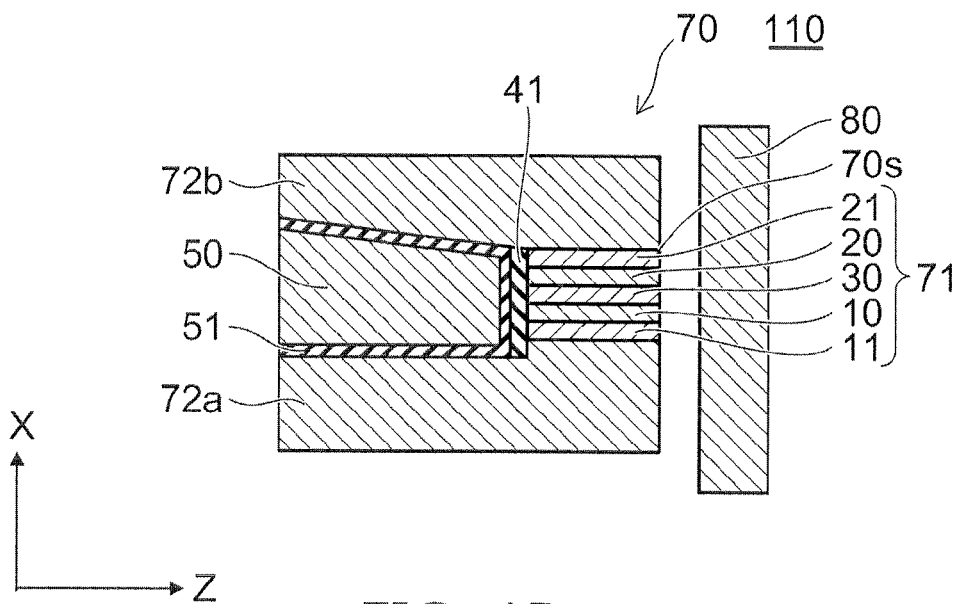

FIG. 1A and FIG. 1B are schematic views illustrating the configuration of a magnetic head according to a first embodiment.

Figure 2:
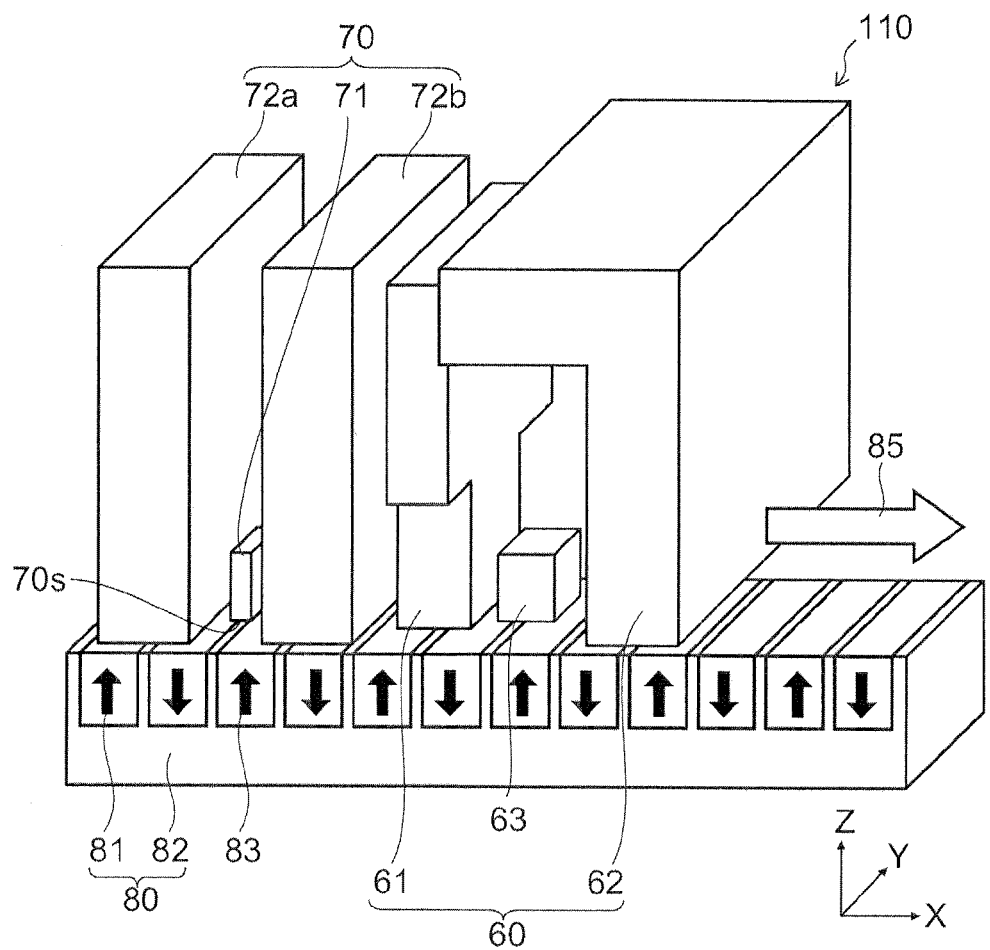
FIG. 2 is a schematic perspective view illustrating the configuration of the magnetic head according to the first embodiment.

FIG. 2 is a schematic perspective view illustrating the configuration of the magnetic head according to the first embodiment.

Figure 3:
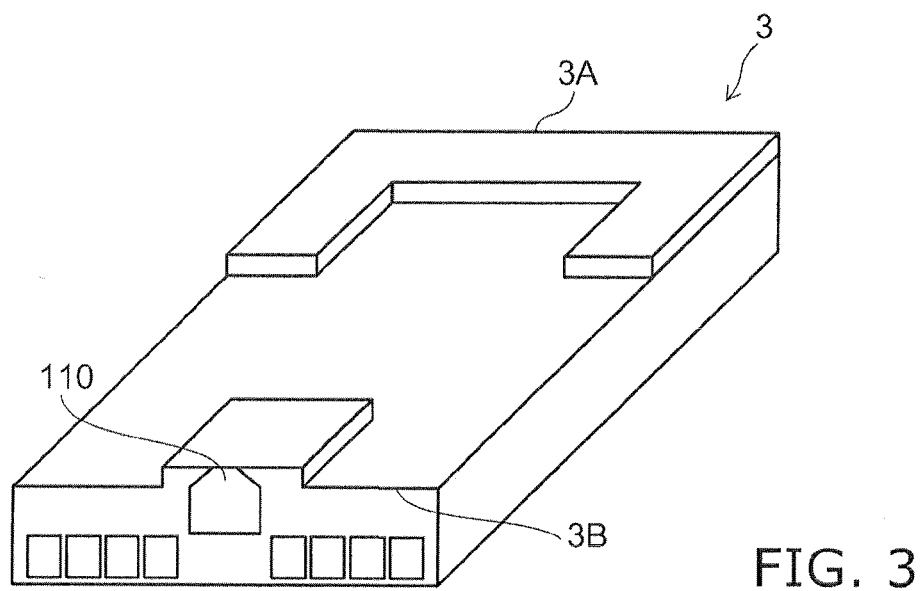
FIG. 3 is a schematic perspective view illustrating the configuration of a head slider mounted with the magnetic head according to the first embodiment.

FIG. 3 is a schematic perspective view illustrating the configuration of a head slider mounted with the magnetic head according to the first embodiment.

An overview of the configuration and an overview of the operation of the magnetic head according to the embodiment will now be described using FIG. 2 and FIG. 3.

As shown in FIG. 2, a magnetic head 110 includes a reproducing unit 70 (a reproducing head unit). The magnetic head 110 may further include a writing unit 60 (a writing head unit).

The writing unit 60 includes, for example, a main magnetic pole 61 and a writing unit return path 62. In the magnetic head 110, the writing unit 60 may further include, for example, a portion that assists the writing operation such as a spin torque oscillator 63 (STO). In the magnetic head 110, the writing unit 60 may have an arbitrary configuration.

The reproducing unit 70 includes, for example, a stacked body 71, a first magnetic shield 72a, and a second magnetic shield 72b. The stacked body 71 is provided between the first magnetic shield 72a and the second magnetic shield 72b.

The components of the reproducing unit 70 mentioned above and the components of the writing unit 60 mentioned above are separated by a not-shown insulator of, for example, alumina.

As shown in FIG. 3, the magnetic head 110 is mounted in a head slider 3. $Al_2O_3$/TiC or the like, for example, is used for the head slider 3. The head slider 3 moves relative to a magnetic recording medium 80 such as a magnetic disk while flying above or being in contact with the magnetic recording medium 80.

The head slider 3 has, for example, an air inflow side 3A and an air outflow side 3B. The magnetic head 110 is disposed at the side surface on the air outflow side 3B of the head slider 3 or the like. Thereby, the magnetic head 110 mounted in the head slider 3 moves relative to the magnetic recording medium S0 while flying above or being in contact with the magnetic recording medium 80.

As shown in FIG. 2, the magnetic recording medium 80 includes, for example, a medium substrate 82 and a magnetic recording layer 81 provided on the medium substrate 82. The magnetization 83 of the magnetic recording layer 81 is controlled by a magnetic field applied from the writing unit 60, and thereby the writing operation is performed. The magnetic recording medium 80 moves relative to the magnetic head 110 along a medium moving direction 85.

The reproducing unit 70 is disposed opposite to the magnetic recording medium 80. The reproducing unit 70 has a medium facing surface 70s (ABS; air bearing surface) opposed to the magnetic recording medium 80. The magnetic recording medium 80 moves relative to the magnetic head 110 along the medium moving direction 85. The reproducing unit 70 detects the direction of the magnetization 83 of the magnetic recording layer 81. Thereby, the reproducing operation is performed. The reproducing unit 70 detects a recorded signal recorded in the magnetic recording medium 80.

The axis in the direction from the magnetic recording medium 80 toward the reproducing unit 70 is defined as, for example, a Z-axis. One axis perpendicular to the Z-axis is defined as an X-axis. The axis perpendicular to the Z-axis and the X-axis is defined as a Y-axis. The X-axis is taken as a first axis, the Z-axis is taken as a second axis, and the Y-axis is taken as a third axis. The Z-axis direction is the height direction. The X-axis direction corresponds to, for example, the recording track traveling direction (track direction) of the magnetic recording medium 80. The Y-axis direction corresponds to, for example, the recording track width direction (track width direction) of the magnetic recording medium 80.

FIG. 1A and FIG. 1B illustrate the configuration of the reproducing unit 70. FIG. 1A is a plan view of the reproducing unit 70 as viewed from the medium facing surface 70s. FIG. 1B is a schematic cross-sectional view illustrating a cross section taken along line A1-A2 of FIG. 1A.

As shown in FIG. 1A and FIG. 1B, the reproducing unit 70 includes the first magnetic shield 72a, the second magnetic shield 72b, the stacked body 71, and a side wall film 40. In the reproducing unit 70, the second magnetic shield 72b is opposed to the first magnetic shield 72a along the X-axis.

In the specification of this application, the state of being opposed includes not only the state of facing directly but also the state of facing via other components.

The stacked body 71 is disposed between the first magnetic shield 72a and the second magnetic shield 72b. The stacked body 71 includes a first magnetic layer 10, a second magnetic layer 20, and an intermediate layer 30. The intermediate layer 30 is provided between the first magnetic layer 10 and the second magnetic layer 20. The intermediate layer 30 is, for example, nonmagnetic.

The second magnetic layer 20 is opposed to the first magnetic layer 10 along the X-axis. That is, the stacking direction of the stacked body 71 lies along the X-axis.

In the specification of this application, "stack" includes not only the case of being directly stacked but also the case of being stacked via other components.

In this example, the intermediate layer 30 is disposed between the first magnetic shield 72a and the second magnetic layer 20, and the first magnetic layer 10 is disposed between the first magnetic shield 72a and the intermediate layer 30.

In this example, the stacked body 71 further includes an underlayer 11 and a cap layer 21. The underlayer 11 is disposed between the first magnetic layer 10 and the first magnetic shield 72a. The cap layer 21 is disposed between the second magnetic layer 20 and the second magnetic shield 72b.

Both of the direction of the magnetization of the first magnetic layer 10 and the direction of the magnetization of the second magnetic layer 20 change in accordance with the medium magnetic field, for example.

The stacked body 71 functions as, for example, a magnetoresistance effect element. The reproducing unit 70 passes a current in the perpendicular-to-film-surface direction of the stacked body 71 to detect a recorded signal from the magnetic recording medium 80. Thereby, the reproducing unit 70 performs the reproducing operation. In the embodiment, the current is supplied to the stacked body 71 via the first magnetic shield 72a and the second magnetic shield 72b. The first magnetic shield 72a and the second magnetic shield 72b function as electrodes.

The stacked body 71 has a side wall 71s. The side wall 71s may be parallel to a plane perpendicular to the stacking direction (the X-axis), but may be non-parallel in view of the ease of manufacturing processes. The side wall 71s intersects a plane perpendicular to the stacking direction (the X-axis) from the first magnetic shield 72a toward second magnetic shield 72b.

The side wall film 40 covers at least a part of the side wall 71s of the stacked body 71. The side wall film 40 includes at least one of Fe and Co. The side wall film 40 has a composition different from the composition of the first magnetic layer 10 and different from the composition of the second magnetic layer 20.

In this example, as shown in FIG. 1A, the second magnetic shield 72b surrounds the stacked body 71 and the side wall film 40 so as to cover the stacked body 71 and the side wall film 40. That is, the second magnetic shield 72b has an upper portion 72f and an opposed portion 72s. The upper portion 72f is a portion substantially covering the upper surface of the stacked body 71. The opposed portion 72s is a portion opposed to the side wall 71s of the stacked body 71 via the side wall film 40. A Ru layer 23 is provided between the upper portion 72f and the opposed portion 72s. The second magnetic shield 72b includes also the Ru layer 23.

The first magnetic shield 72a has a protrusion 73 provided in a portion opposed to the stacked body 71. The protrusion 73 is formed by, for example, over-etching a layer that forms the first magnetic shield 72a.

As shown in FIG. 1B, a hard bias film 50 is provided in the reproducing unit 70. The stacked body 71 is disposed between the hard bias film 50 and the magnetic recording medium 80.

A back-side side wall film 41 may be provided on a surface of the stacked body 71 opposed to the hard bias film 50. The configuration of the back-side side wall film 41 is substantially the same as the configuration of the side wall film 40.

An insulating layer 51 is provided between a portion of the first magnetic shield 72a not opposed to the stacked body 71 and a portion of the second magnetic shield 72b not opposed to the stacked body 71, between the first magnetic shield 72a and the hard bias film 50, between the second magnetic shield 72b and the hard bias film 50, and between the hard bias film 50 and the back-side side wall film 41.

In the magnetic head 110, a high-sensitivity magnetic head can be provided by providing the side wall film 40. This configuration according to the embodiment and the effect thereof are based on a phenomenon newly found by the results of an experiment independently conducted by the inventors of this application. The example will now be described.

In the experiment, a CoFe electrode corresponding to the first magnetic shield 72a was used. As the underlayer 11, a stacked film in which a Ta film with a thickness of 3 nm (nanometers) and a Cu film with a thickness of 2 nm were stacked was used. As the first magnetic layer 10, an artificial lattice film in which Co films and Ni films were alternately stacked was used. The entire thickness of the artificial lattice film is 8 nm. As the intermediate layer 30, a Cu film with a thickness of 2 nm was used. As the second magnetic layer 20, an FeCoNi alloy film with a thickness of 10 nm was used. As the cap layer 21, a Ru film with a thickness of 5 nm was used. As an upper electrode corresponding to the second magnetic shield 72b, a NiFe film was used. The magnetization of the first magnetic layer 10 is fixed, and the magnetization of the second magnetic layer 20 is variable in accordance with the external magnetic field.

In this experiment, a stacked film of the underlayer 11, the first magnetic layer 10, the intermediate layer 30, the second magnetic layer 20, and the cap layer 21 was formed on the CoFe electrode corresponding to the first magnetic shield 72a, and RIE (reactive ion etching) was performed to process the stacked film to form the stacked body 71. Then, the upper electrode was formed on the stacked body 71.

At this time, the etching time in the processing of the stacked film mentioned above was changed to fabricate a plurality of samples, and the magnetic characteristics of the samples were investigated. That is, an external magnetic field H was applied while a voltage (an applied voltage VI) was applied between the CoFe electrode and the upper electrode of the samples, and the change in the resistance dR (ohm; Ω) of the samples was measured while the magnitude of the external magnetic field H was changed.

Figure 4A:
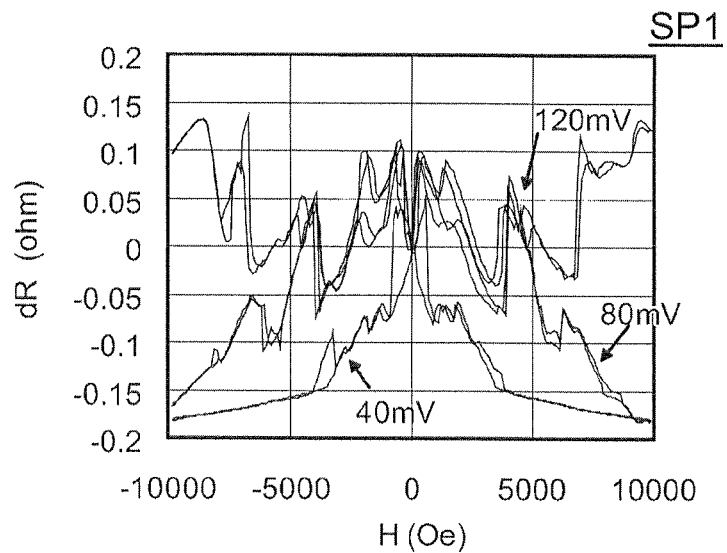
FIG. 4A and FIG. 4B are graphs illustrating characteristics of magnetic heads.
Figure 4B:
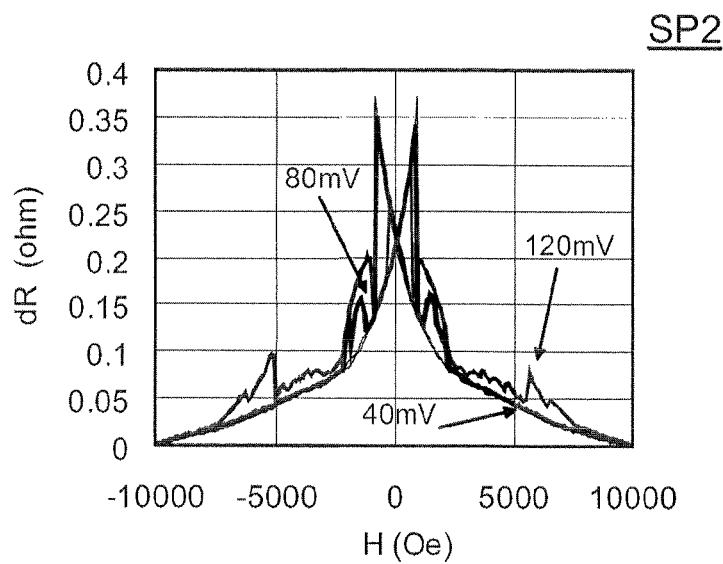

FIG. 4A and FIG. 4B are graphs illustrating characteristics of magnetic heads.

FIG. 4A and FIG. 4B correspond to a first sample SP1 and a second sample SP2, respectively. In the first sample SP1, the etching time in the processing of the stacked film is shorter than in the second sample SP2. In the second sample SP2, the etching time was long, and the CoFe layer was over-etched. In the first sample SP1, the CoFe layer is not substantially over-etched.

The horizontal axis of FIG. 4A and FIG. 4B is the external magnetic field H applied (oersted; Oe). The vertical axis is the change in the resistance dR (Ω). The change in the resistance dR is the difference with the resistance when the external magnetic field H is not applied.

As shown in FIG. 4A, in the first sample SP1 in which the etching time is short, no oscillation phenomenon is observed when (the absolute value of) the applied voltage VI is 40 mV.

An oscillation phenomenon was observed at 80 mV and 120 mV. The oscillation is due to spin torque. Thus, in the first sample SP1, the spin torque oscillation critical voltage is 80 mV.

As shown in FIG. 4B, in the second sample SP2 in which the etching time is long, the oscillation phenomenon is not clear when (the absolute value of) the applied voltage VI is 40 mV to 120 mV. Thus, in the second sample SP2, the spin torque oscillation critical voltage is larger than approximately 120 mV.

In the second sample SP2, since the etching time is long, the surface of the CoFe electrode has been over-etched. By the over-etching, a compound including the elements (Co and Fe) included in the CoFe electrode adheres onto the side wall 71s of the stacked body 71 to form the side wall film 40. In this example, the side wall film 40 is an oxide layer including Fe and Co.

Thus, it has been found that the spin torque oscillation critical voltage can be increased to twice or more when the etching time is long. This means that the density of current that can be passed can be increased to twice or more without making spin torque oscillation.

The reproduction sensitivity of the stacked body 71 (a magneto-resistance effect element) is proportional to the product of the density J of current passed through the stacked body 71 and the area resistance change ratio AdR. The upper limit of the current density J in conventional magneto-resistance change elements has been determined by heat generation. However, according to the investigation by the inventors of this application, it is considered that, in fine elements in future ultrasensitive magnetic recording and reproduction, the upper limit of the current density J will be determined not by heat generation but by the oscillation phenomenon due to spin torque. That is, in ultrasensitive magnetic recording and reproduction, spin torque oscillation occurs to cause noise, and this adversely influences reproduction. Thus, if the magneto-resistance effect element is miniaturized with improvement in the recording density, the area resistance needs to be decreased in order to keep the resistance of the element at a desired value. If the area resistance is decreased, the current density is increased in order to improve the reproduction sensitivity, and magnetic noise resulting from spin torque is generated. Hence, a new configuration that suppresses spin torque oscillation in a fine element is desired.

The embodiment solves the new issue of suppressing spin torque oscillation. The phenomenon newly found from the experimental results described above is used to solve the issue.

That is, the side wall film 40 covering at least a part of the side wall 71s of the stacked body 71 and including at least one of Fe and Co is provided. Thereby, spin torque oscillation in the stacked body 71 can be suppressed. Thus, the current density J can be increased, and the sensitivity can be improved.

The side wall film 40 is electrically non-conductive in order to appropriately pass a current through the stacked body 71. The side wall film 40 is substantially insulative. On the other hand, the first magnetic layer 10 and the second magnetic layer 20 are electrically conductive. That is, the side wall film 40 has a composition different from the composition of the first magnetic layer 10 and different from the composition of the second magnetic layer 20.

Thus, it has been found that the spin torque oscillation critical voltage is increased when a compound layer (the side wall film 40) including a magnetic element is adhered to the side wall 71s of the stacked body 71. This phenomenon is presumed to be due to the fact that the effective damping of the first magnetic layer 10 and the second magnetic layer 20 may have increased.

Examples of the configuration of the magnetic head 110 will now be described.

For the underlayer 11, for example, a nonmagnetic metal such as Ta, Ru, or Cu is used. The underlayer 11 may have a configuration in which layers of a plurality of materials are stacked. A stacked film of a Ta film and a Cu film, for example, may be used as the underlayer 11.

As the first magnetic layer 10 and the second magnetic layer 20, for example, a Heusler alloy (CoFeAlSi, CoFeMnGe, or the like) may be used. The Heusler alloy has a large magneto-resistance effect. An FeCoX alloy (X being at least one of Ge, Ga, Si, and Al or the like) may be used for the first magnetic layer 10 and the second magnetic layer 20. When the soft magnetic properties are insufficient, a configuration in which NiFe layers are stacked, for example, may be used for the layer of the material mentioned above.

As the intermediate layer 30, for example, a metal layer of Cu or the like or an insulating layer of MgO or the like may be used. A structure in which a minute conductive region of a magnetic metal (e.g. an FeCo alloy etc.) is provided in an insulating layer may be used for the intermediate layer 30. A structure in which a minute conductive region of a nonmagnetic metal (e.g. Cu etc.) is provided in an insulating layer may be used for the intermediate layer 30.

For the cap layer 21, for example, a nonmagnetic metal such as Ta, Ru, or Cu is used.

The direction of the track width direction component (the Y-axis component) of the magnetization in the first magnetic layer 10 is opposite to the direction of the track width direction component (the Y-axis component) of the magnetization in the second magnetic layer 20. When the first magnetic layer 10 and the second magnetic layer 20 are finely patterned, inevitably a certain level of magnetostatic coupling in which magnetizations are aligned in the opposite directions occurs. If the inevitable magnetostatic coupling is insufficient, the magnetization alignment in the opposite directions can be strengthened by using a Cu layer with a thickness of approximately 1 nm as the intermediate layer 30.

For the side wall film 40, a compound including at least one element of Fe and Co is used. The side wall film 40 has a composition different from those of the first magnetic layer 10 and the second magnetic layer 20. The side wall film 40 has a thickness of, for example, not less than the thickness of a one-atom layer and not more than 5 nm. The side wall film 40 can be formed by, for example, over-etching the first magnetic shield 72a when the stacked body 71 is patterned by etching.

An FeCo alloy, for example, is used as the surface layer of the first magnetic shield 72a. Thereby, a compound including Fe or Co re-adheres to the side wall 71s of the stacked body 71. The protrusion 73 is formed in the first magnetic shield 72a due to the over-etching. The side wall film 40 is formed also on the side wall of the protrusion 73. Also a portion of the side wall film 40 formed on the side wall of the protrusion 73 has the effect of suppressing spin torque oscillation.

A NiFe alloy, for example, is used for portions other than the protrusion 73 of the first magnetic shield 72a (portions that form a main region of the first magnetic shield 72a). The magnetic shield effect is enhanced by using a NiFe alloy. Therefore, the FeCo region of the protrusion 73 is preferably small (thin).

The side wall film 40 further includes at least one of oxygen, nitrogen, and carbon. These elements derive from, for example, a resist material used as a mask member in patterning. The side wall film 40 can be made to include nitrogen by using a gas including nitrogen gas in etching. By the side wall film 40 including at least one of oxygen, nitrogen, and carbon, the resistance of the side wall film 40 becomes higher than the resistance of the stacked body 71. Thereby, the leakage of current passed through the stacked body 71 to the side wall film 40 is reduced.

The back-side side wall film 41 can be formed by a method similar to the method for forming the side wall film 40. However, the back-side side wall film 41 may be omitted when a sufficient effect is obtained by means of the side wall film 40 provided at the end in the track width direction.

A sense current is passed through the stacked body 71 in the perpendicular-to-film-surface direction by the first magnetic shield 72a and the second magnetic shield 72b. The resistance change of the stacked body 71 due to the medium magnetic field is detected as the change in the output voltage. Thereby, a reproduced signal is obtained. By disposing the stacked body 71 between the first magnetic shield 72a and the second magnetic shield 72b, reproduction of minute recording bits is enabled.

As described above, the upper portion 72f and the opposed portion 72s may be provided in the second magnetic shield 72b. The Ru layer 23 may be provided between the upper portion 72f and the opposed portion 72s. The Ru layer 23 can provide an antiferromagnetic coupling. The direction of the magnetization of the upper portion 72f is aligned antiparallel to the direction of the magnetization of the opposed portion 72s.

For example, the position where the Ru layer 23 is interposed is set at the same level as the intermediate layer 30. That is, the Ru layer 23 is disposed in a position overlaying the intermediate layer 30 when projected onto a plane parallel to the Z-axis. Thereby, a bias magnetic field is applied to the second magnetic layer 20 from the upper portion 72f, and a bias magnetic field is applied to the first magnetic layer 10 from the opposed portion 72s. That is, such bias magnetic fields that the direction of the magnetization of the first magnetic layer 10 becomes opposite to the direction of the magnetization of the second magnetic layer 20 are applied. Thus, the track width direction components of the magnetization of the first magnetic layer 10 and the magnetization of the second magnetic layer 20 are stabilized.

The Ru layer 23 is provided as necessary and may be omitted. An ultrathin insulating layer of $Al_2O_3$ or the like is preferably provided between the opposed portion 72s and the stacked body 71. Thereby, the sense current can be more concentrated to the stacked body 71. The opposed portion 72s functions as a magnetic shield and has the effect of reducing the level of magnetic noise signals caused by adjacent recording tracks.

The hard bias film 50 is disposed on the back side of the stacked body 71 away from the magnetic recording medium 80. An insulating region is disposed between the hard bias film 50 and the stacked body 71. The direction of the magnetization of the hard bias film 50 is, for example, the Z-axis direction. By appropriately setting the bias magnetic field from the hard bias film 50, the magnetization of the first magnetic layer 10 and the magnetization of the second magnetic layer 20 can be inclined at an angle with respect to the Z-axis direction of approximately 45 degrees.

Figure 5A:
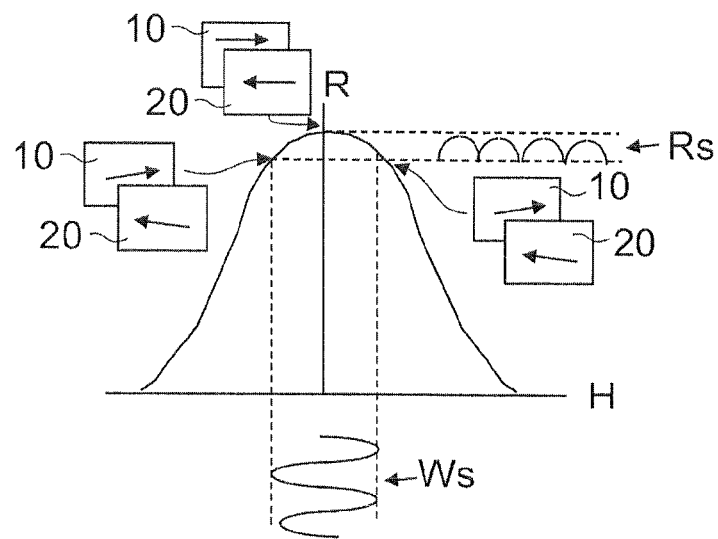
FIG. 5A and FIG. 5B are graphs illustrating characteristics of the magnetic head.
Figure 5B:
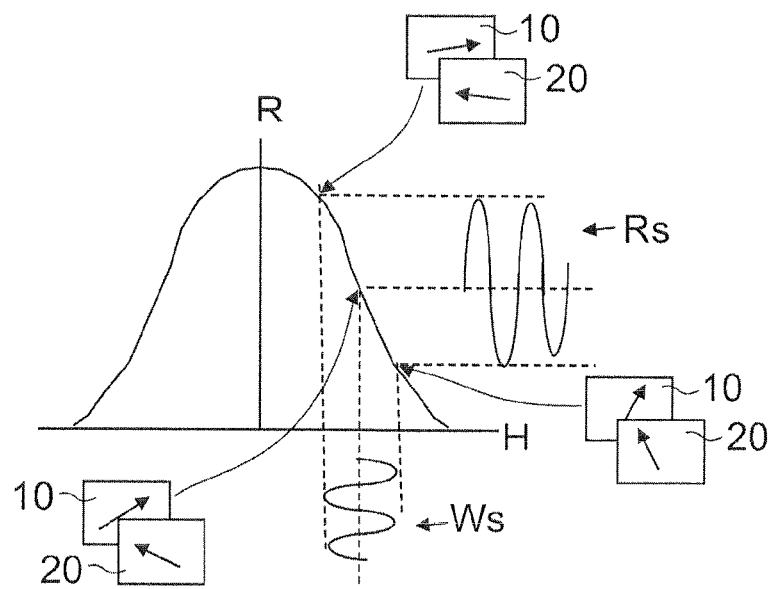

FIG. 5A and FIG. 5B are graphs illustrating characteristics of the magnetic head.

FIG. 5A corresponds to a state where no hard bias magnetic field is applied to the stacked body 71, and FIG. 5B corresponds to a state where a hard bias magnetic field is applied. The horizontal axis of the graphs is the medium magnetic field H of the magnetic recording medium 80. The vertical axis is the resistance R of the stacked body 71.

As shown in FIG. 5A, in the case where no hard bias magnetic field is applied, when the medium magnetic field H is 0, the magnetization of the first magnetic layer 10 is aligned substantially in the opposite direction to the magnetization of the second magnetic layer 20. At this time, the resistance R reaches a maximum. The resistance R is reduced in both the positive and negative medium magnetic field signals Ws. Consequently, in the reproduced signal Rs, no linear response of resistance increase and decrease is obtained in accordance with the positive and negative medium magnetic fields H. Furthermore, also the output of the reproduced signal Rs is small.

In contrast, as shown in FIG. 5B, by appropriately setting the hard bias magnetic field, a linear response is obtained in the reproduced signal Rs, and also the output of the reproduced signal Rs can be increased.

For the hard bias film 50, a Co-based alloy such as CoPt, an ordered FePt alloy, or the like may be used. A stacked structure of an IrMn film and an FeCo film may be used for the hard bias film 50.

Figure 6A:
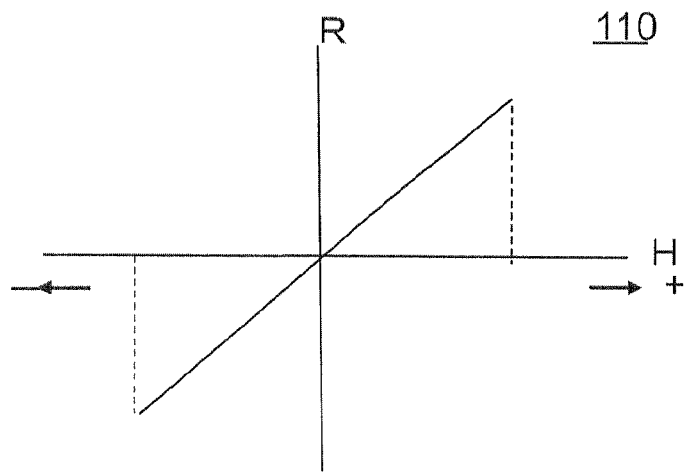
FIG. 6A and FIG. 6B are graphs illustrating characteristics of magnetic heads.
Figure 6B:
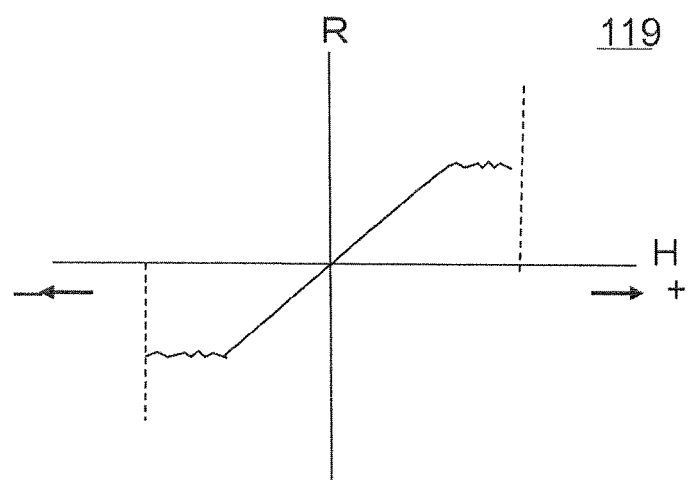

FIG. 6A and FIG. 6B are graphs illustrating characteristics of magnetic heads.

FIG. 6A corresponds to the characteristics of the magnetic head 110 according to the embodiment. FIG. 6B corresponds to the characteristics of a magnetic head 119 of a reference example. In the magnetic head 119, the side wall film 40 is not provided. The magnetic head 119 corresponds to, for example, the case where the etching time in the processing of the stacked body 71 is short and the first magnetic shield 72a is not over-etched. The horizontal axis of the drawings is the medium magnetic field H. The vertical axis is the resistance R of the stacked body 71. The resistance R corresponds to the reproduced signal.

As shown in FIG. 6B, in the magnetic head 119 in which the side wall film 40 is not provided, noise is generated in the reproduced signal when a certain level or more of medium magnetic field H is applied. The noise is due to spin torque oscillation. Conventionally, in order to suppress noise, the sense current density is decreased to suppress spin torque oscillation. However, if the sense current density is decreased, the sensitivity is reduced.

In contrast, in the magnetic head 110 according to the embodiment, the side wall film 40 suppresses spin torque oscillation and also suppresses the occurrence of noise. Consequently, even when the sense current density is high, spin torque oscillation is suppressed and reproduction with a high S/N ratio is enabled. Thus, the embodiment can provide a high-sensitivity magnetic head.

Figure 7A:
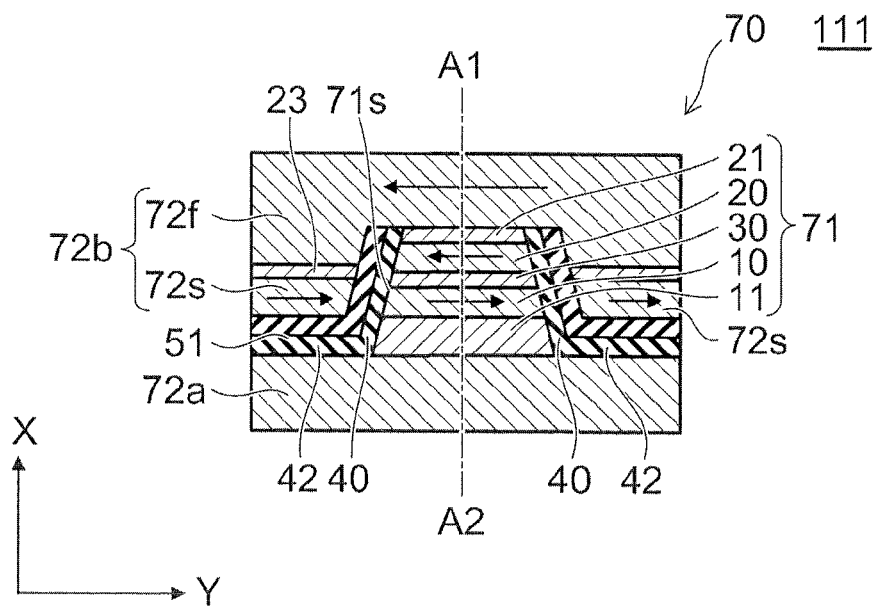
FIG. 7A and FIG. 7B are schematic views illustrating the configuration of another magnetic head according to the first embodiment.
Figure 7B:
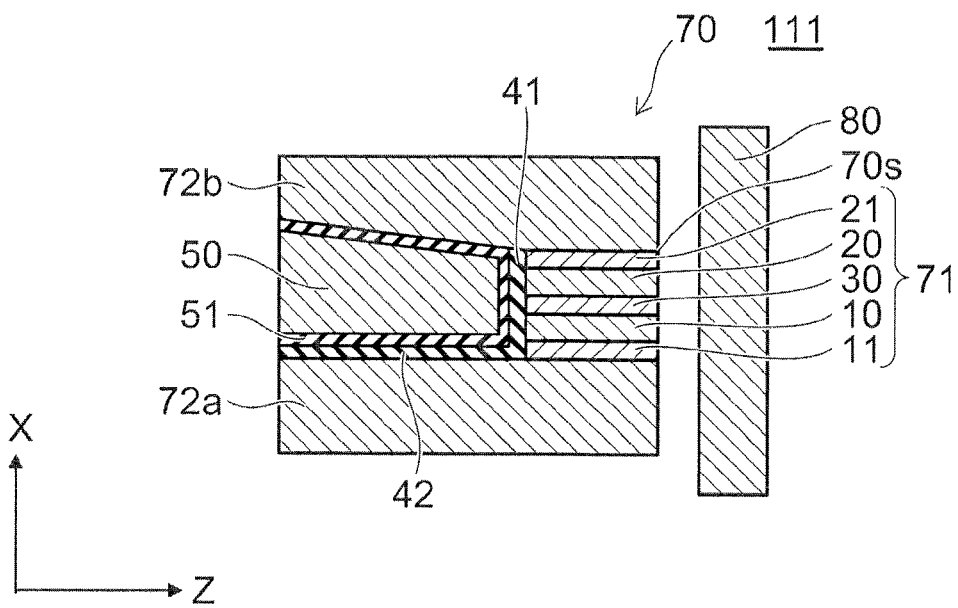

FIG. 7A and FIG. 7B are schematic views illustrating the configuration of another magnetic head according to the first embodiment.

FIG. 7A is a plan view of the reproducing unit 70 as viewed from the medium facing surface 70s. FIG. 7B is a schematic cross-sectional view illustrating a cross section taken along line A1-A2 of FIG. 7A.

As shown in FIG. 7A and FIG. 7B, in a magnetic head 111 according to the embodiment, a coating film 42 is provided on a surface of the first magnetic shield 72a not opposed to the stacked body 71. Also in the magnetic head 111, the side wall film 40 covering the side wall of the stacked body 71 is provided. In addition, the back-side side wall film 41 is provided. The coating film 42 is continuous and integrated with the side wall film 40 and the back-side side wall film 41. Otherwise, the configuration is similar to the magnetic head 110, and a description is therefore omitted.

In the magnetic head 111, for example, a film that forms the stacked body 71 is processed to form the stacked body 71, and then a film that forms the side wall film 40, the back-side side wall film 41, and the coating film 42 is deposited so as to cover the upper surface of the first magnetic shield 72a exposed and the side wall 71s of the stacked body 71. This film includes at least one of Fe and Co, and is a film different from the composition of the first magnetic layer 10 and different from the composition of the second magnetic layer 20.

Also the magnetic head 111 can provide a high-sensitivity magnetic head.

The film that forms the side wall film 40, the back-side side wall film 41, and the coating film 42 is formed in an arbitrary stage between forming the stacked body 71 and forming the second magnetic shield 72b and the hard bias film 50. The film that forms the side wall film 40, the back-side side wall film 41, and the coating film 42 is formed also on the upper surface (the surface opposed to the second magnetic shield 72b) of the stacked body 71. The film in this portion can be removed by processing using conditions whereby the side wall film 40 remains.

Figure 8A:
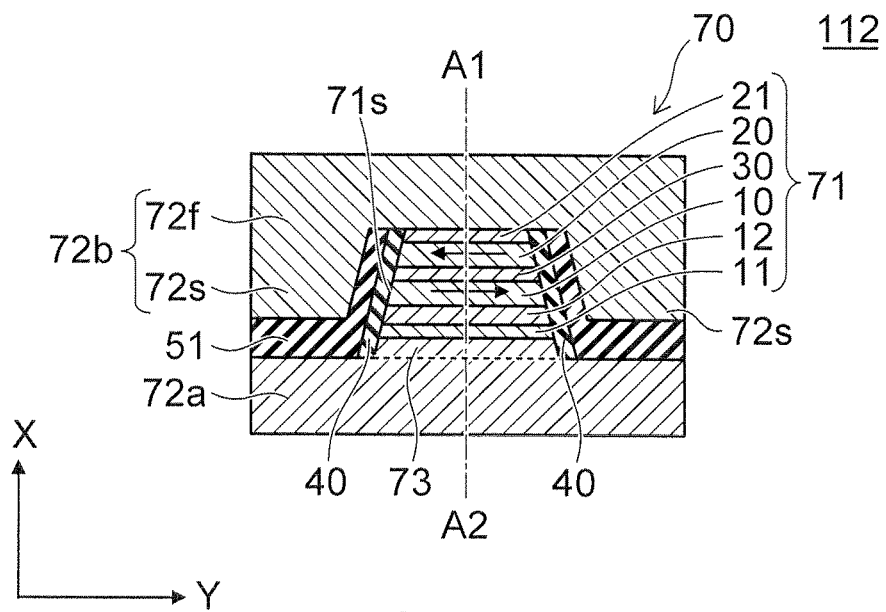
FIG. 8A and FIG. 8B are schematic views illustrating the configuration of another magnetic head according to the first embodiment.
Figure 8B:
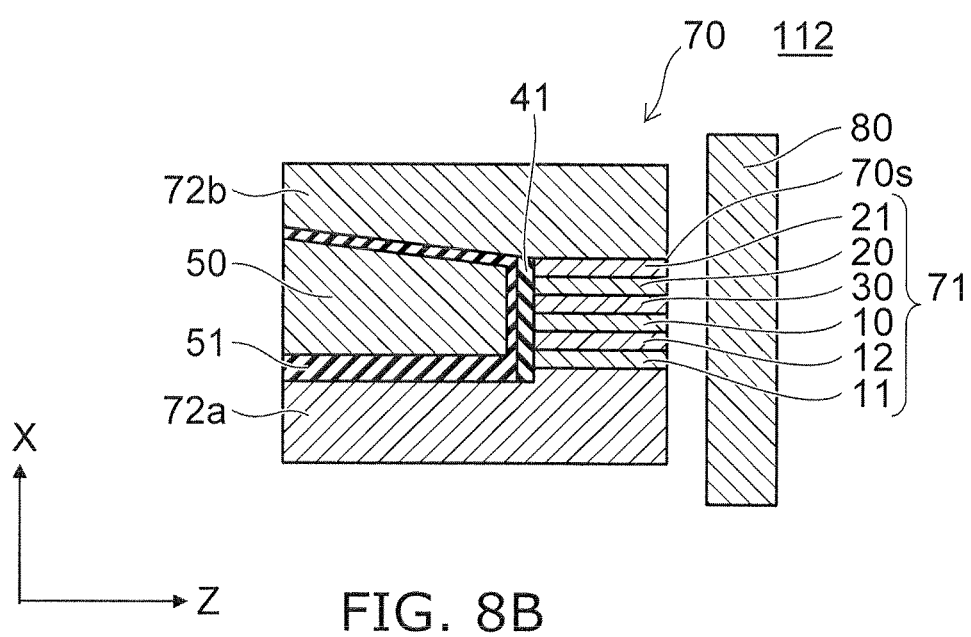

FIG. 8A and FIG. 8B are schematic views illustrating the configuration of another magnetic head according to the first embodiment.

FIG. 8A is a plan view of the reproducing unit 70 as viewed from the medium facing surface 70s. FIG. 8B is a schematic cross-sectional view illustrating a cross section taken along line A1-A2 of FIG. 8A.

As shown in FIG. 8A and FIG. 8B, in a magnetic head 112 according to the embodiment, the stacked body 71 further includes an antiferromagnetic layer 12. The first magnetic layer 10 is disposed between the antiferromagnetic layer 12 and the intermediate layer 30. That is, the antiferromagnetic layer 12 is disposed between the underlayer 11 and the first magnetic layer 10. In this example, the Ru layer 3 is not provided. Otherwise, the configuration is similar to the magnetic head 110, and a description is therefore omitted.

In this example, the first magnetic layer 10 is used as a magnetization fixed layer. In the magnetization fixed layer, the direction of the magnetization is substantially fixed. The second magnetic layer 20 is used as a magnetization free layer. In the magnetization free layer, the direction of the magnetization is variable. The antiferromagnetic layer 12 fixes the magnetization of the first magnetic layer 10. IrMn or the like, for example, is used for the antiferromagnetic layer 12. The first magnetic layer 10 preferably has, for example, a stacked configuration of a magnetic layer (an FeCo-based alloy etc.)/a Ru layer/a magnetic layer (an FeCo-based alloy etc.). In the magnetic head 112, the Ru layer 23 mentioned above can be omitted by providing the antiferromagnetic layer 12.

Also in the magnetic head 112, spin torque oscillation can be suppressed by the side wall film 40, and a high-sensitivity magnetic head can be provided.

Figure 9:
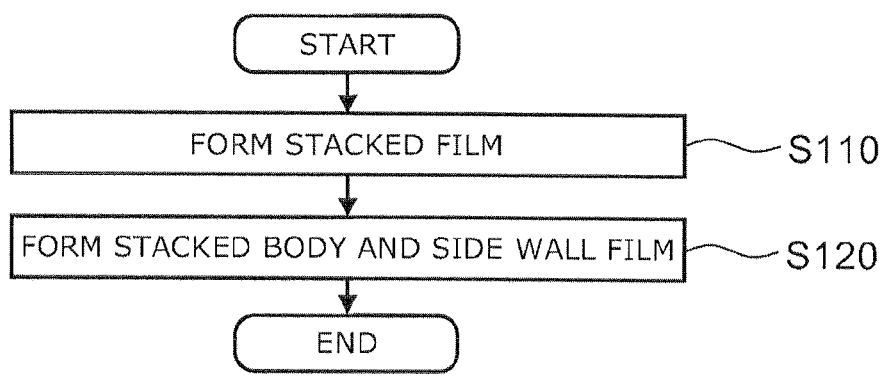
FIG. 9 is a flow chart illustrating a method for manufacturing a magnetic head according to the first embodiment.

FIG. 9 is a flow chart illustrating a method for manufacturing a magnetic head according to the first embodiment.

Figure 10A:
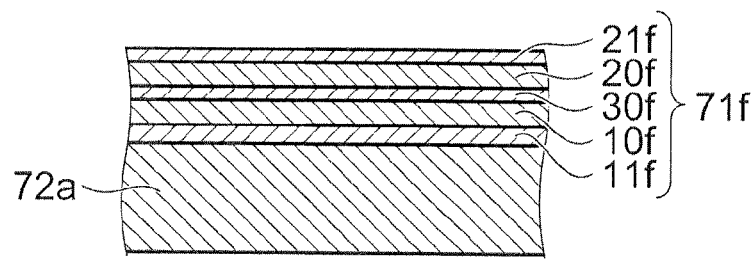
FIG. 10A to FIG. 10C are schematic cross-sectional views in order of the processes, illustrating a method for manufacturing a magnetic head according to the first embodiment.
Figure 10B:
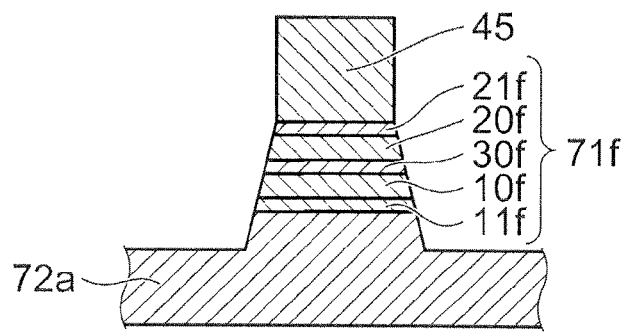
Figure 10C:
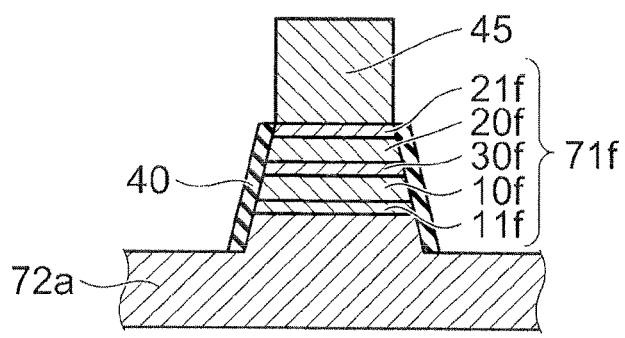

FIG. 10A to FIG. 10C are schematic cross-sectional views in order of the processes, illustrating a method for manufacturing a magnetic head according to the first embodiment.

As shown in FIG. 9 and FIG. 10A, in the manufacturing method, a stacked film 71f is formed on the first magnetic shield 72a (step S110). The stacked film 71f forms the stacked body 71. The stacked body 71 includes the first magnetic layer 10, the second magnetic layer 20, and the intermediate layer 30 provided between the first magnetic layer 10 and the second magnetic layer 20. In this example, an underlayer film 11f that forms the underlayer 11 is formed on the first magnetic shield 72a, a first magnetic film 10f that forms the first magnetic layer 10 is formed on the underlayer film 11f, an intermediate film 30f that forms the intermediate layer 30 is formed on the first magnetic film 10f, a second magnetic film 20f that forms the second magnetic layer 20 is formed on the intermediate film 30f, and a cap film 21f that forms the cap layer 21 is formed on the second magnetic film 20f. The first magnetic shield 72a includes at least one of Fe and Co.

As shown in FIG. 9, the stacked body 71 and the side wall film 40 are formed (step S120).

For example, as shown in FIG. 10B, a mask member 45 having a prescribed configuration is formed on the stacked film 71f. Etching is performed using the mask member 45 as a mask to remove a part of the stacked film 71f to form the stacked body 71.

Further, as shown in FIG. 10C, the first magnetic shield 72a is over-etched and a material included in the first magnetic shield 72a is caused to adhere to the side wall 71s of the stacked body 71; thus, the side wall film 40 is formed. The side wall film 40 includes at least one of Fe and Co, and has a composition different from the composition of the first magnetic layer 10 and different from the composition of the second magnetic layer 20.

After that, the second magnetic shield 72b is formed on the stacked body 71; thus, the reproducing unit is formed. The reproducing unit detects the medium magnetic field recorded in the magnetic recording medium.

By the method, the side wall film 40 can be formed with good controllability and good productivity. The manufacturing method can provide a method for manufacturing a high-sensitivity magnetic head.

Also the following method may be employed. Step S110 is performed to form the stacked film 71f. After that, a part of the stacked film 71f may be removed by etching to form the stacked body 71, and meanwhile the side wall film 40 may be formed by causing a material included in the stacked film 71f to adhere to the side wall 71s of the stacked body 71.

Third Embodiment

The magnetic head according to the first embodiment described above may, for example, be incorporated in an integrated recording/reproducing magnetic head assembly and be installed in a magnetic recording and reproducing apparatus. The magnetic recording and reproducing apparatus according to the embodiment may have only the reproducing function or both the recording function and the reproducing function.

Figure 11:
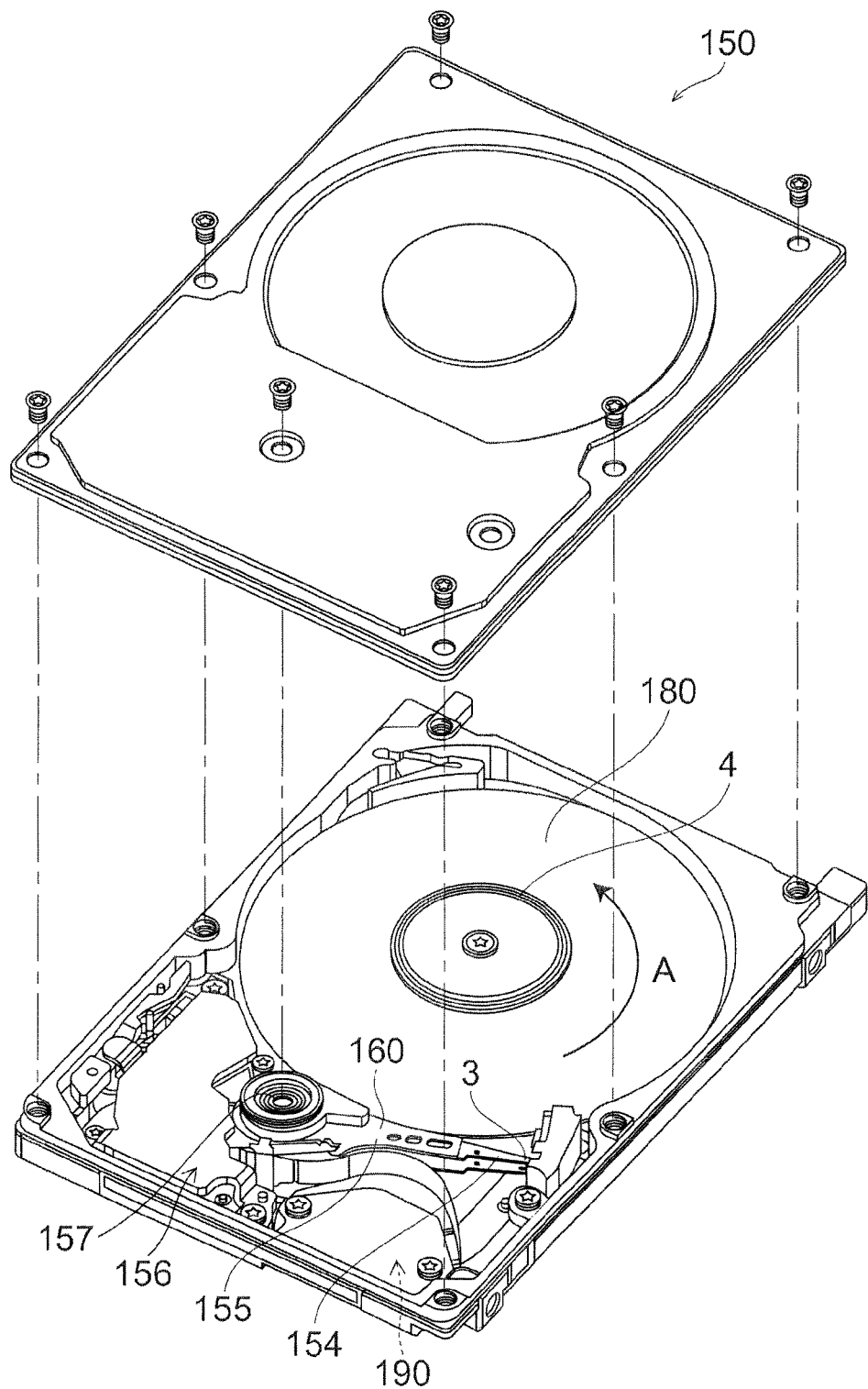
FIG. 11 is a schematic perspective view illustrating the configuration of a magnetic recording and reproducing apparatus according to a third embodiment.

FIG. 11 is a schematic perspective view illustrating the configuration of a magnetic recording and reproducing apparatus according to a third embodiment.

Figure 12A:
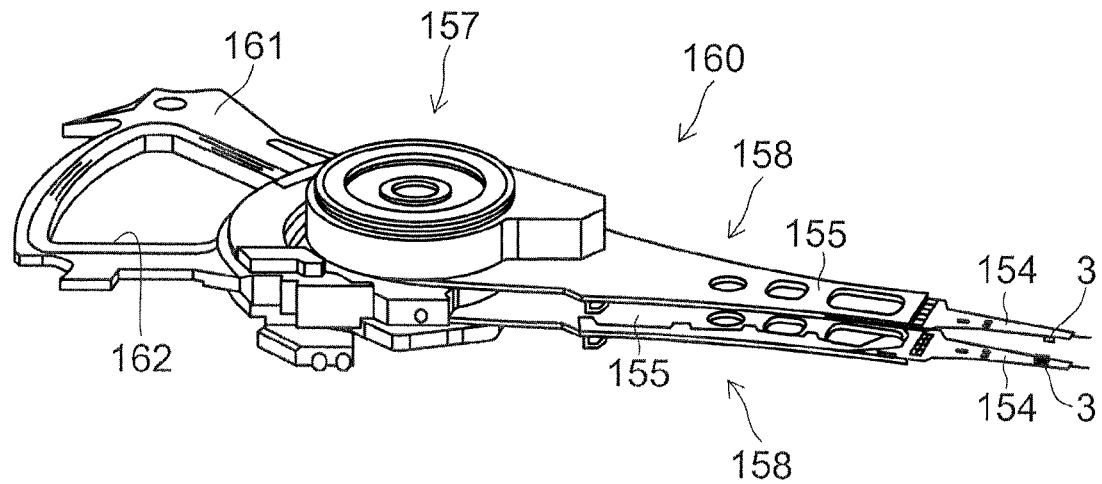
FIG. 12A and FIG. 12B are schematic perspective views illustrating the configuration of part of a magnetic recording apparatus according to the third embodiment.
Figure 12B:
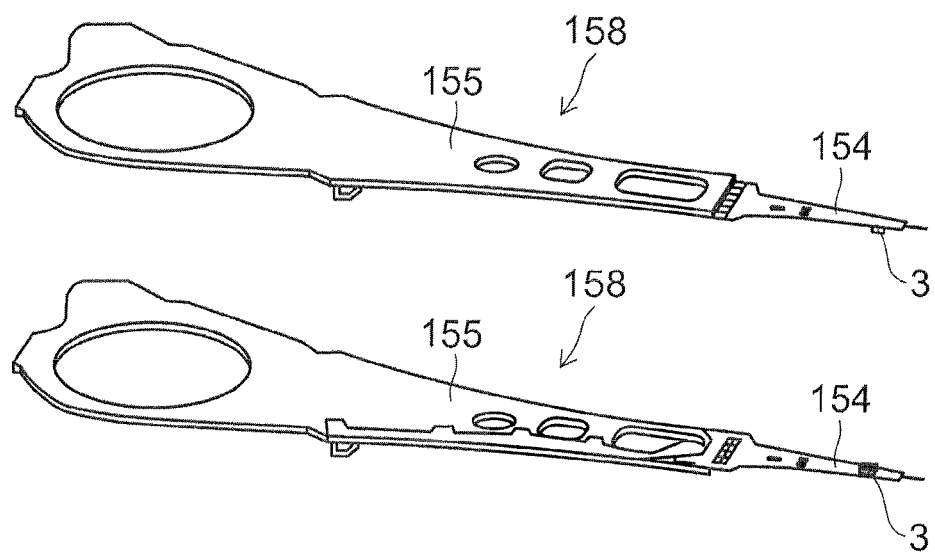

FIG. 12A and FIG. 12B are schematic perspective views illustrating the configuration of a part of a magnetic recording apparatus according to the third embodiment.

As shown in FIG. 11, a magnetic recording and reproducing apparatus 150 according to the embodiment is an apparatus of a system using a rotary actuator. A recording medium disk 180 is mounted on a spindle motor 4. The recording medium disk 180 is rotated in the direction of arrow A by spindle motor 4. The motor responds to a control signal from a not-shown driving device control unit, for example. The magnetic recording and reproducing apparatus 150 according to the embodiment may include a plurality of recording medium disk 180.

The recording and reproduction of information stored in the recording medium disk 180 are performed by the head slider 3. The head slider 3 has the configuration illustrated above. The head slider 3 is provided at the tip of a suspension 154. The suspension 154 is in a thin film form. One of the magnetic heads (e.g. the magnetic heads 110 to 112) according to the embodiments described above or a modification thereof, for example, is mounted near the tip of the head slider 3.

When the recording medium disk 180 rotates, the head slider 3 is held above the surface of the recording medium disk 180. That is, the pressing pressure by the suspension 154 and the pressure generated at the medium facing surface (ABS) of the head slider 3 are balanced. Thereby, the distance between the medium facing surface of the head slider 3 and the surface of the recording medium disk 180 is kept at a prescribed value. In the embodiment, also what is called a "contact-traveling type" may be used in which the head slider 3 is in contact with the recording medium disk 180.

The suspension 154 is connected to one end of an actuator arm 155. The actuator arm 155 includes, for example, a bobbin that holds a not-shown driving coil and the like. A voice coil motor 156 is provided at the other end of the actuator arm 155. The voice coil motor 156 is, for example, a kind of linear motor. The voice coil motor 156 may include, for example, a not-shown driving coil and a magnetic circuit. The driving coil is, for example, wound around the bobbin of the actuator arm 155. The magnetic circuit may include, for example, a not-shown permanent magnet and a not-shown opposed yoke. The permanent magnet and the opposed yoke are opposed to each other, and the driving coil is disposed between them.

The actuator arm 155 is held by not-shown ball bearings, for example. The ball bearings are, for example, provided at two positions, the top and bottom, of a bearing portion 157. The actuator arm 155 can rotationally slide freely by means of the voice coil motor 156. Consequently, the magnetic head can be moved to an arbitrary position on the recording medium disk 180.

FIG. 12A illustrates the configuration of a part of the magnetic recording and reproducing apparatus, and is an enlarged perspective view of a head stack assembly 160.

FIG. 12B is a perspective view illustrating a magnetic head assembly (head gimbal assembly; HGA) 158 that is a part of the head stack assembly 160.

As shown in FIG. 12A, a head stack assembly 160 includes the bearing portion 157, a head gimbal assembly 158, and a support frame 161. The head gimbal assembly 158 extends from the bearing portion 157. The support frame 161 extends from the bearing portion 157 in the opposite direction to the HGA. The support frame 161 supports the coil 162 of the voice coil motor.

As shown in FIG. 12B, the head gimbal assembly 158 includes the actuator arm 155 and the suspension 154. The actuator arm 155 extends from the bearing portion 157. The suspension 154 extends from the actuator arm 155.

The head slider 3 is provided at the tip of the suspension 154. One of the magnetic heads according to the embodiments or a modification thereof is mounted in the head slider 3.

That is, the magnetic head assembly (the head gimbal assembly) 158 according to the embodiment includes the magnetic head according to the embodiment, the head slider 3 mounted with the magnetic head, the suspension 154 mounted with the head slider 3 on one end, and the actuator arm 155 connected to the other end of the suspension 154.

The suspension 154 includes lead wires (not shown) for writing and reading signals, for a heater for adjusting the flying height, and for other purposes. These lead wires and the respective electrodes of the magnetic head incorporated in the head slider 3 are electrically connected.

In addition, a signal processing unit 190 is provided that uses the magnetic head to perform the writing and reading of signals on the magnetic recording medium.

The signal processing unit 190 is provided on the back side, in FIG. 11, of the magnetic recording and reproducing apparatus 150 illustrated in FIG. 11, for example. The input/output lines of the signal processing unit 190 are connected to the electrode pads of the head gimbal assembly 158 to be electrically connected to the magnetic head.

That is, the signal processing unit 190 is electrically connected to the magnetic head.

The change in the resistance of the stacked body 71 of the magnetic head in accordance with the medium magnetic field recorded in the magnetic recording medium 80 is detected by, for example, the signal processing unit 190.

Thus, the magnetic recording and reproducing apparatus 150 according to the embodiment includes the magnetic recording medium, the magnetic head according to the embodiments mentioned above, a movable unit that allows the magnetic recording medium and the magnetic head to move relatively in a state of keeping both apart or in contact, a position control unit that positions the magnetic head at a prescribed recording position on the magnetic recording medium, and the signal processing unit that uses the magnetic head to perform the writing and reading of signals on the magnetic recording medium.

That is, the recording medium disk 180 is used as the magnetic recording medium 80 mentioned above. The movable unit mentioned above may include the head slider 3.

The position control unit mentioned above may include the head gimbal assembly 158.

Thus, the magnetic recording and reproducing apparatus 150 according to the embodiment includes the magnetic recording medium, the magnetic head assembly according to the embodiment, and the signal processing unit 190 that uses the magnetic head mounted on the magnetic head assembly to perform the writing and reading of signals on the magnetic recording medium.

The magnetic recording and reproducing apparatus 150 according to the embodiment enables high-sensitivity reproduction by using the magnetic head according to the embodiments mentioned above.

The embodiment provides a high-sensitivity magnetic head, a high-sensitivity magnetic head assembly, a high-sensitivity magnetic recording and reproducing apparatus, and a method for manufacturing a high-sensitivity magnetic head.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may appropriately select specific configurations of components of magnetic heads such as reproducing units, stacked bodies, first magnetic layers, second magnetic layers, intermediate layers, underlayers, cap layers, side wall films, first magnetic shields, second magnetic shields, and writing units, components of magnetic head assemblies such as head sliders, suspensions, and actuator arms, and components of magnetic recording and reproducing apparatuses such as magnetic recording media from known art and similarly practice the invention. Such practice is included in the scope of the invention to the extent that similar effects thereto are obtained. For example, the materials, compositions, film thicknesses, etc. described in the embodiments mentioned above are only examples, and may be variously selected.

Further, any two or more components of the specific examples may be combined within the extent of technical feasibility and are included in the scope of the invention to the extent that the purport of the invention is included.

Moreover, all magnetic heads, magnetic head assemblies, magnetic recording and reproducing apparatuses, and methods for manufacturing a magnetic head practicable by an appropriate design modification by one skilled in the art based on the magnetic heads, the magnetic head assemblies, the magnetic recording and reproducing apparatuses, and the methods for manufacturing a magnetic head described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a magnetic head, the method comprising:
    forming a stacked film on a first magnetic shield including at least one of Fe and Co, the stacked film being configured to form a stacked body, the stacked body including a first magnetic layer, a second magnetic layer, and an intermediate layer provided between the first magnetic layer and the second magnetic layer;
    forming the stacked body by removing a part of the stacked film by etching;
    forming a side wall film by over-etching the first magnetic shield to cause a material included in the first magnetic shield to adhere to a side wall of the stacked body, the side wall film including at least one of Fe and Co and having a composition different from a composition of the first magnetic layer and different from a composition of the second magnetic layer; and
    forming a second magnetic shield on the stacked body to form a reproducing unit.

2. The method according to claim 1, wherein the side wall film includes at least one of oxygen, nitrogen, and carbon.

3. The method according to claim 1, wherein the side wall film includes a compound including at least one of oxygen, nitrogen, and carbon.

4. The method according to claim 1, wherein the side wall film includes an oxide including at least one of oxygen, nitrogen, and carbon.

5. The method according to claim 1, wherein the side wall film is electrically non-conductive.

6. The method according to claim 1, wherein a thickness of the side wall film is not less than a thickness of a one-atom layer and not more than 5 nm.

7. The method according to claim 1, wherein at least one of the first magnetic shield and the second magnetic shield includes at least one of CoFeAlSi, CoFeMnGe, FeCoGe, FeCoGa, FeCoSi, and FeCoAl.

8. The method according to claim 1, wherein
    the first magnetic layer is disposed between the first magnetic shield and the intermediate layer.

9. The method according to claim 1, wherein
    the side wall film includes at least one element selected from oxygen, nitrogen, and carbon, and
    the element is introduced from a resist material used as a mask used in one of the etching and over-etching.

10. The method according to claim 1, wherein one of the etching and over-etching is performed by using a gas including nitrogen gas.

11. The method according to claim 1, wherein
    the stacked body has an air bearing surface and an opposite surface opposite to the air bearing surface,
    the forming the side wall film includes forming a back-side side wall film on the opposite surface by the over-etching the first magnetic shield, and
    the back-side side wall film includes the at least one of Fe and Co and has a composition different from the composition of the first magnetic layer and different from the composition of the second magnetic layer.

12. The method according to claim 11, wherein the back-side side wall film includes at least one of oxygen, nitrogen, and carbon.

13. The method according to claim 11, wherein the back-side side wall film includes a compound including at least one of oxygen, nitrogen, and carbon.

14. The method according to claim 11, wherein the back-side side wall film includes an oxide including at least one of oxygen, nitrogen, and carbon.

15. The method according to claim 11, wherein the back-side side wall film is electrically non-conductive.

16. The method according to claim 11, wherein a thickness of the back-side side wall film is not less than a thickness of a one-atom layer and not more than 5 nm.

* * * * *